United States Patent
Cho et al.

(10) Patent No.: US 9,991,296 B2
(45) Date of Patent: *Jun. 5, 2018

(54) LIQUID CRYSTAL DISPLAY WITH PIXEL TRANSISTORS HAVING DIFFERENT CHANNEL WIDTHS

(71) Applicant: SAMSUNG DISPLAY CO., LTD., Yongin-si, Gyeonggi-do (KR)

(72) Inventors: Se Hyoung Cho, Yongin-si (KR); Il Gon Kim, Yongin-si (KR); Sung Hwan Kim, Yongin-si (KR); Mee Hye Jung, Yongin-si (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/617,205

(22) Filed: Jun. 8, 2017

(65) Prior Publication Data

US 2017/0271382 A1   Sep. 21, 2017

Related U.S. Application Data

(63) Continuation of application No. 14/465,999, filed on Aug. 22, 2014, now Pat. No. 9,679,927.

(30) Foreign Application Priority Data

Feb. 17, 2014  (KR) .................. 10-2014-0018052

(51) Int. Cl.
  *H01L 29/04*  (2006.01)
  *H01L 29/10*  (2006.01)
  *H01L 31/00*  (2006.01)
  *H01L 27/12*  (2006.01)
  *G09G 3/36*  (2006.01)
  (Continued)

(52) U.S. Cl.
  CPC ....... *H01L 27/1288* (2013.01); *G09G 3/3648* (2013.01); *H01L 27/124* (2013.01); *H01L 27/1222* (2013.01); *H01L 29/41733* (2013.01); *H01L 29/42384* (2013.01);
  (Continued)

(58) Field of Classification Search
  CPC ............ H01L 27/1288; H01L 27/1222; H01L 29/42384; H01L 29/41733; H01L 27/124; G09G 3/3648; G09G 2360/16; G09G 2320/0285; G09G 2300/0426
  See application file for complete search history.

(56) References Cited

U.S. PATENT DOCUMENTS 6,385,115 B1  5/2002  Nakai
6,982,775 B2  1/2006  Lee et al.
(Continued)

FOREIGN PATENT DOCUMENTS

JP    2004-93821 A      3/2004
KR   10-2001-0113170 A  12/2001
(Continued)

*Primary Examiner* — Ismail Muse
(74) *Attorney, Agent, or Firm* — Lee & Morse, P.C.

(57) ABSTRACT

A liquid crystal display includes a first pixel and a second pixel that extend in a data line direction. The first and second pixels are connected to a same data line, and the first pixel is closer to a data driver than the second pixel. A channel width of a thin film transistor of the first pixel is less than a channel width of a thin film transistor of the second pixel.

14 Claims, 16 Drawing Sheets

(51) Int. Cl.
*H01L 29/417* (2006.01)
*H01L 29/423* (2006.01)

(52) U.S. Cl.
CPC ............. *G09G 2300/0426* (2013.01); *G09G 2320/0285* (2013.01); *G09G 2360/16* (2013.01)

(56) References Cited

U.S. PATENT DOCUMENTS

| | | |
|---|---|---|
| 8,248,550 B2 | 8/2012 | Lee |
| 9,679,927 B2 * | 6/2017 | Cho .................... H01L 27/1288 |
| 2004/0090561 A1 | 5/2004 | Song |
| 2007/0081105 A1 | 4/2007 | Park et al. |
| 2009/0033817 A1 | 2/2009 | Ooida et al. |
| 2010/0039575 A1 | 2/2010 | Lee |
| 2010/0182345 A1 | 7/2010 | Shimoshikiroh et al. |
| 2010/0328563 A1 | 12/2010 | Chang et al. |
| 2012/0320297 A1 | 12/2012 | Itsumi et al. |
| 2014/0014963 A1 | 1/2014 | Yamazaki et al. |

FOREIGN PATENT DOCUMENTS

| | | |
|---|---|---|
| KR | 10-0448048 B1 | 9/2004 |
| KR | 10-2007-0074779 A | 7/2007 |
| KR | 10-2008-0046009 A | 5/2008 |
| KR | 10-2008-0108739 A | 12/2008 |
| KR | 10-2011-0078986 A | 7/2011 |
| KR | 10-1166830 B1 | 7/2012 |
| KR | 10-2013-0027845 A | 3/2013 |
| KR | 10-1244691 B1 | 3/2013 |
| KR | 10-1298432 B1 | 8/2013 |

* cited by examiner

LIQUID CRYSTAL DISPLAY WITH PIXEL TRANSISTORS HAVING DIFFERENT CHANNEL WIDTHS

CROSS-REFERENCE TO RELATED APPLICATIONS

This is a continuation application based on pending application Ser. No. 14/465,999, filed Aug. 22, 2014, the entire contents of which is hereby incorporated by reference.

Korean Patent Application No. 10-2014-0018052, filed on Feb. 17, 2014, and entitled, "Liquid Crystal Display and Method Of Manufacturing the Same," is incorporated by reference herein in its entirety.

BACKGROUND

1. Field

One or more embodiments described herein relate to a display device and a method of manufacturing the same.

2. Description of the Related Art

A liquid crystal display is typically from a liquid crystal layer between two panels. The panels include field generating electrodes such as pixel electrodes and one or more common electrodes. A voltage is applied to the electrodes generates an electric field in the liquid crystal layer. This field controls the orientation of liquid crystal molecules in the liquid crystal layer and the polarization of incident light, to thereby display an image.

SUMMARY

In accordance with one embodiment, a liquid crystal display includes a substrate including pixels in a display area; a plurality of gate lines crossing a plurality of data lines; a gate driver to apply a gate signal to the gate lines; and a data driver to apply data signals to the data lines, wherein: a first pixel and a second pixel extend in a direction of the data lines, the first and second pixels are connected to a same data line, he first pixel is closer to the data driver than the second pixel, and a channel width of a thin film transistor of the first pixel is less than a channel width of a thin film transistor of the second pixel.

The channel widths of thin film transistors of respective pixels may increase with increasing distance from the data driver in the direction of data lines. The thin film transistors may each include a gate electrode, a source electrode connected one of the data lines, and a drain electrode, and a size of the source electrode may increase with increasing distance from the data driver in the data line direction. The channel lengths of the thin film transistors may be substantially equal at locations farther away from the data driver in the data line direction.

The thin film transistors of respective pixels may each include a gate electrode, a source electrode connected to the data line, and a drain electrode, the pixels may include an third pixel and an fourth pixel disposed in the gate line direction and are connected to a same gate line, the third pixel may be closer to the gate driver than the fourth pixel, and a parasitic capacitance between the gate electrode and drain electrode of a thin film transistor of the third pixel may be less than a parasitic capacitance between the gate electrode and drain electrode of a thin film transistor of the fourth pixel.

The parasitic capacitance of the thin film transistors may increase with increasing distance from the gate driver in a gate line direction. A size of the gate electrodes of respective ones of the thin film transistors may increase with increasing distance away from the gate driver in the gate line direction.

An overlapping area of the gate electrode and drain electrode of respective ones of the thin film transistors may increase with increasing distance from the gate driver in the gate line direction. Channel widths of the thin film transistors may be substantially equal at locations away from the gate driver in the gate line direction.

The gate lines may include a first gate line and a second gate line, a first parasitic capacitance distribution of the first gate line may be different from a second parasitic capacitance distribution of the second gate line, and the first and second parasitic capacitance distributions may have substantially a step pattern having step widths that increase with increasing distance from the gate driver.

The drain electrode of the thin film transistor of the fourth pixel may have a width that gradually increases, and an edge of the gate electrode of the thin film transistor of the fourth pixel crosses a portion having a width of the drain electrode of the thin film transistor of the fourth pixel that gradually increases.

A width of a portion where an edge of the gate electrode of the thin film transistor of the third pixel crosses the drain electrode of the thin film transistor of the third pixel may be less than a width of the portion where the edge of the gate electrode of the thin film transistor of the fourth pixel crosses the drain electrode of the thin film transistor of the fourth pixel. The drain electrode of the thin film transistor of the third pixel may have a width that gradually increases.

Each of the gate electrodes of the thin film transistors may include an opening, and the opening may cross the drain electrode and has a shape with a width that gradually decreases.

An area of a portion where the opening of the gate electrode of the thin film transistor of the third pixel crosses the drain electrode of the thin film transistor of the third pixel may be greater than an area of a portion where the opening of the gate electrode of the thin film transistor of the fourth pixel crosses the drain electrode of the thin film transistor of the fourth pixel.

A portion where the drain electrode of the thin film transistor of the fourth pixel overlaps the gate electrode of the thin film transistor of the fourth pixel may be rotated relative to a portion where the drain electrode of the thin film transistor of the third pixel overlaps the gate electrode of the thin film transistor of the third pixel.

In accordance with another embodiment, a method is provided for manufacturing a liquid crystal display having a display area including a plurality of pixels, each of the pixels including at least one thin film transistor, each of the thin film transistors including a gate electrode, source electrode, and drain electrode. The method includes forming gate lines on a substrate having a display area; forming a plurality of data lines crossing the gate lines; forming a gate driver to apply gate signals to the gate lines; forming a data driver to apply data signals to the data lines; and forming a mask to form the gate electrode, source electrode, and drain electrode of each of the pixels, wherein forming the mask includes varying a parasitic capacitance Cgd between the gate electrode and drain electrode of each of the pixels based on positions of the pixels using the following equation:

$$C'_{gd}(n, m) = \frac{V_{kb}(1, 1)}{V_{kb}(n, m)} \times C_{gd}(n, m)$$

where Cgd' correspond to a varied parasitic capacitances Cgd, n corresponds to a row in the display area, m corresponds to a column in the display area, and Vkb corresponds to the kick-back voltage.

Forming the mask may include calculating kick-back voltage Vkb for each of a plurality of polarities based on pixel position after varying the parasitic capacitance Cgd; recalculating the parasitic capacitance; calculating an average deviation of positive and negative kick-back voltages in the kick-back voltages Vkb for each polarity; calculating luminance deviation for pixel positions based on the average deviation of the kick-back voltages Vkb; and comparing the luminance deviation with a just noticeable difference. Calculating the parasitic capacitance Cgd may be repeatedly performed when the luminance deviation is greater than the just noticeable difference.

A first pixel and a second pixel may be disposed in a direction of the data line are connected to a same data line, the first pixel may be closer to a data driver than the second pixel, and a channel width of a thin film transistor of the first pixel may be less than a channel width of a thin film transistor of the second pixel.

In accordance with another embodiment, liquid crystal display includes at least one signal line and a plurality of pixels adjacent the at least one signal line, wherein each of the pixels includes a transistor coupled between a pixel electrode and the at least one signal line, and wherein sizes of at least one electrode of the transistors of the pixels change in a direction of the at least one signal line.

The at least one electrode may have substantially a U shape. The sizes of the at least one electrode of the transistors may increase in the direction of the at least one signal line. The at least one signal line may be a data line. Channel widths of the transistors may increase in the direction of the at least one signal line, and wherein channel lengths of the transistors are substantially equal.

The at least one electrode may be a source or drain. The at least one electrode may be a gate. The at least one signal line may be a gate line.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
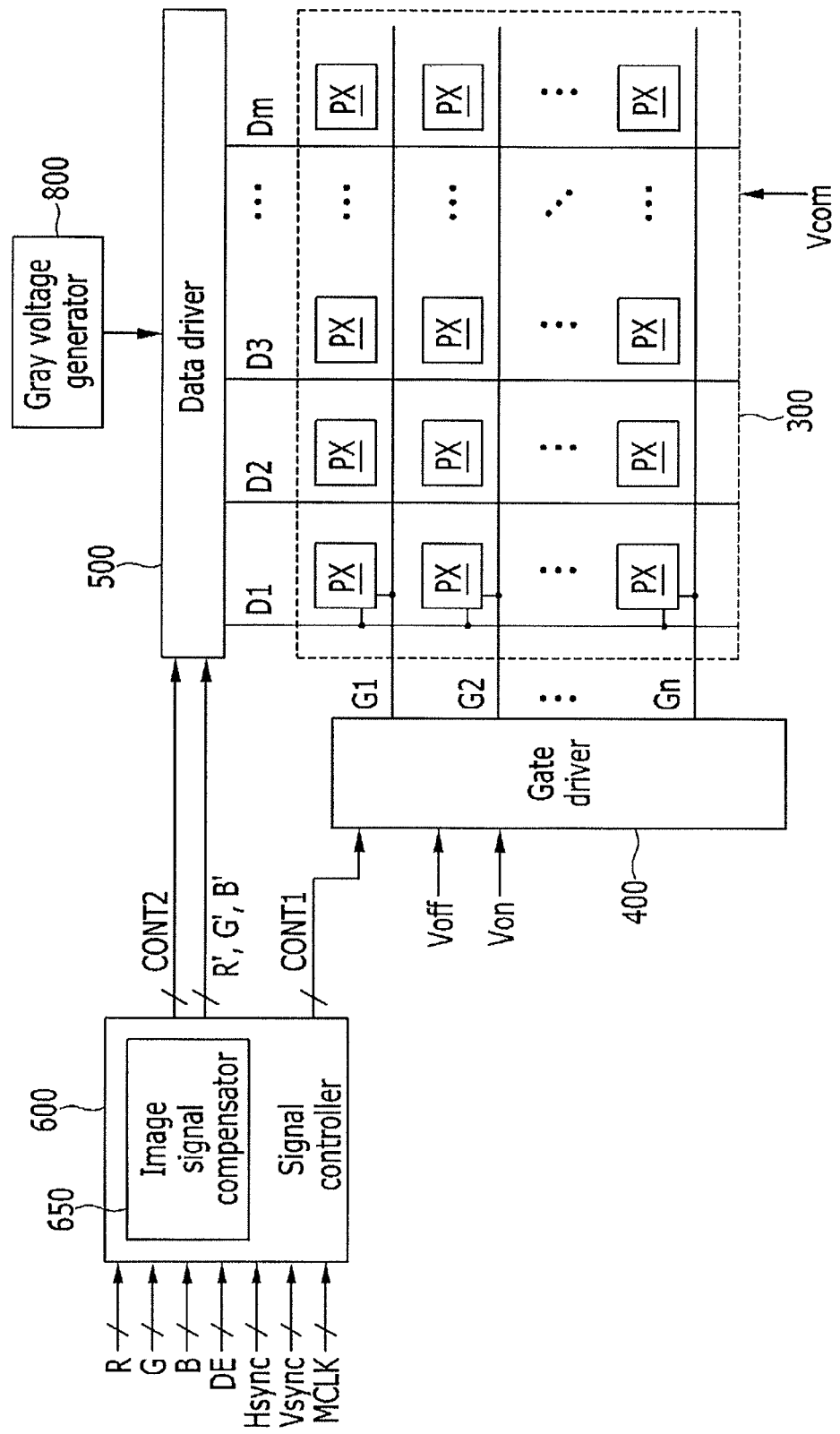
FIG. 1 illustrates an embodiment of a liquid crystal display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
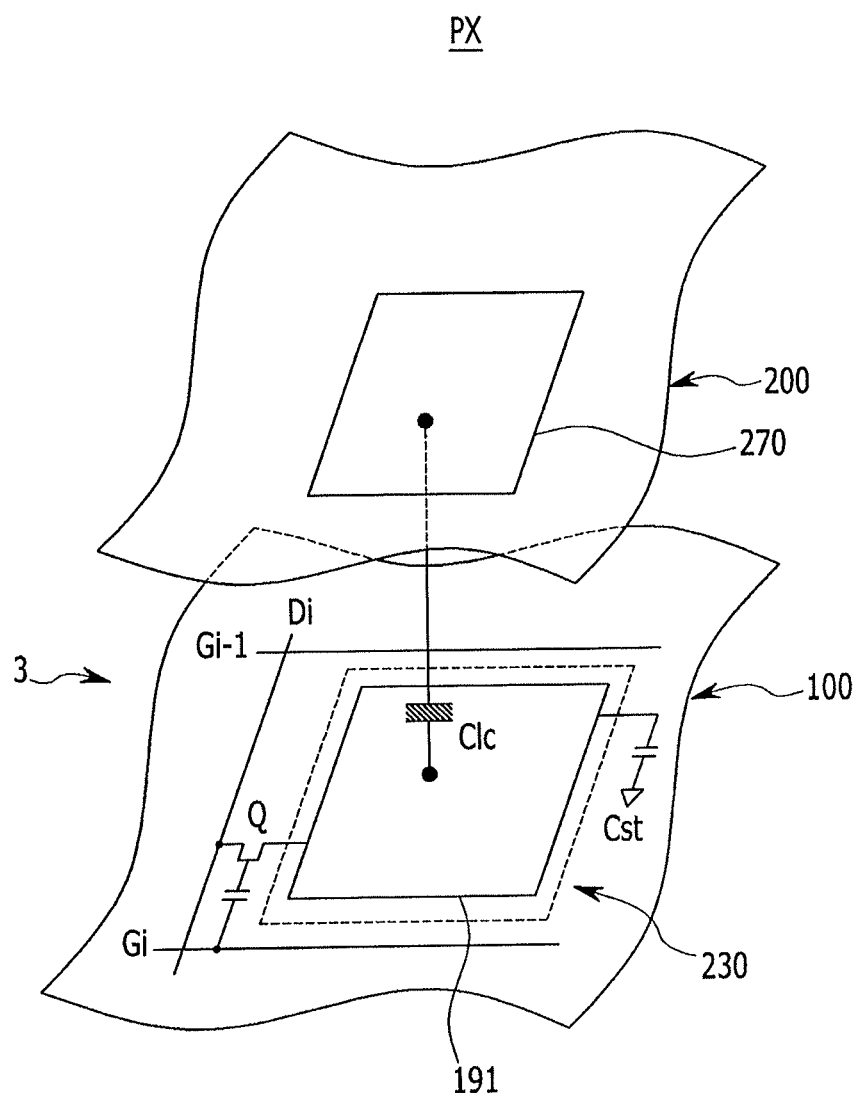
FIG. 2 illustrates an embodiment of a pixel of the liquid crystal display.

FIG. 1 illustrates an embodiment of a liquid crystal display, and FIG. 2 illustrates an embodiment of a pixel in the liquid crystal display. Referring to FIG. 1, the liquid crystal display includes a liquid crystal panel assembly 300, a gate driver 400, a data driver 500, a gray voltage generator 800, and a signal controller 600. The signal controller 600 includes an image signal compensation unit 650.

Referring to FIG. 1, in an equivalent circuit of liquid crystal panel assembly 300, the liquid crystal panel assembly 300 includes a plurality of signal lines G1-Gn and D1-Dm, and a plurality of pixels PX arranged in an approximate matrix. In FIG. 2, liquid crystal panel assembly 300 includes a liquid crystal layer 3 between a lower panel 100 and an upper panel 200. The liquid crystal panel assembly 300 may correspond to a display area on a substrate.

The signal lines G1-Gn and D1-Dm include a plurality of gate lines G1 to Gn for transmitting gate signals (referred to as "scanning signals") and a plurality of data lines D1 to Dm for transmitting data voltages. The gate lines G1 to Gn are parallel to each other and extend approximately in a row direction. The data lines D1 to Dm are in parallel to each other and extend approximately in a column direction.

Each pixel PX includes a switching element Q connected to signal lines Gi and Dj, and a liquid crystal capacitor Clc and a storage capacitor Cst that are connected thereto. (For illustrative purposes, a pixel PX connected to an i-th (i=1, 2, . . . , n) gate line Gi and a j-th (j=1, 2, . . . , m) data line Dj is discussed). In an alternative embodiment, storage capacitor Cst may be omitted. In the present embodiment, the switching element may be a thin film transistor.

The switching element Q is a three terminal element such as a thin film transistor provided to lower panel 100. A control terminal of switching element Q is connected to gate line Gi, an input terminal is connected to data line Dj, and an output terminal is connected to liquid crystal capacitor Clc and storage capacitor Cst.

The liquid crystal capacitor Clc has two terminals coupled to two electrodes, namely pixel electrode 191 of lower panel 100 and common electrode 270 of upper panel 200. The liquid crystal layer 3 is located between electrodes 191 and 270 and serves as a dielectric material. The pixel electrode 191 is connected to the switching element. The common electrode 270 is formed on the entire surface of upper panel 200 and receives common voltage Vcom. In an alternative embodiment, common electrode 270 may be formed on lower panel 100, and at least one of the two electrodes 191 or 270 may have a linear shape or a bar shape.

The storage capacitor Cst serves as an auxiliary to liquid crystal capacitor Clc. Storage capacitor Cst is formed as a separate signal line provided on lower panel 100 and pixel electrode 191, overlapping it with an insulator therebetween. A predetermined voltage (e.g., common voltage Vcom) is applied to the separate signal line. In other embodiments, storage capacitor Cst may be formed by pixel electrode 191 and an overlying previous gate line which overlap each other via the insulator.

For color display, each pixel PX may uniquely represent one of a plurality of primary colors (i.e., spatial division) or each pixel PX may sequentially represent the primary colors in turn (i.e., temporal division). As a result, a spatial or temporal sum of the primary colors may be recognized as a desired color. An example of the primary colors includes red, green, and blue colors. FIG. 2 shows a spatial division example in which each pixel PX includes a color filter 230 representing one of the primary colors in an area of lower panel 100 corresponding to pixel electrode 191. The color filter 230 may be made, for example, of an organic insulator. At least one light polarizer may be provided in liquid crystal panel assembly 300.

Figure 3:
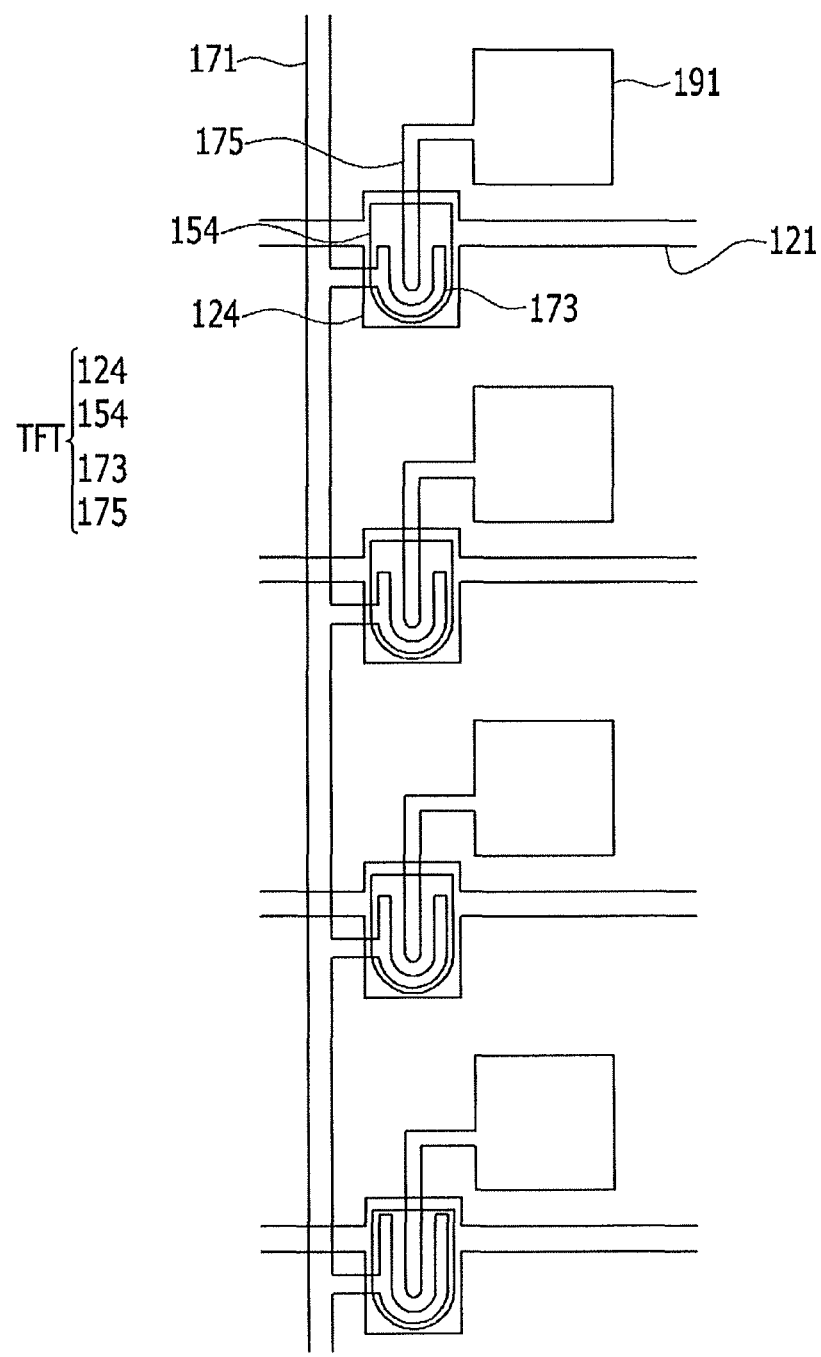
FIG. 3 illustrates an embodiment of a thin film transistor with a shape that changes based on a data line direction.

FIG. 3 illustrates one embodiment of a thin film transistor which has a shape that changes based on a data line direction in the liquid crystal display. Referring to FIG. 3, four pixels are illustratively disposed in a direction of data line 171. A size of source electrode 173 of the thin film transistor (TFT) increases approaching a lower end. As shown in FIG. 1, when data driver 500 which inputs a data signal to the data lines 171 is at an upper end of liquid crystal panel assembly 300, a signal delay is generated from one end close to data driver 500 (e.g., the input terminal of the data signal) to the other end outermost from data driver 500. In an alternative embodiment, when data driver 500 is at the lower end of the liquid crystal panel assembly 300 as well as the upper end, the signal delay may be generated closer to the center portion of the liquid crystal panel assembly 300.

In the present embodiment, when two pixels PX disposed in the direction of data line 171 are selected (respectively referred to as a P pixel and a Q pixel), channel widths of the P and Q pixels may be different. When the P pixel is closer to data driver 500 than the Q pixel, the channel width of the TFT in the P pixel is smaller than the channel width of the TFT in the Q pixel.

In the present embodiment, to differentiate the channel width, source electrode 173 formed with a U shape may control a length of a portion enclosing drain electrode 175. Also, in the present embodiment, the channel widths of TFTs corresponding to pixels PX may increase with increasing distance from data driver 500 based on the direction of data line 171. In this case, although the channel width changes, the channel lengths of the TFTs may be the same.

In other proposed displays, a charge time is extended to sufficiently charge voltages to pixels that are far away from data driver and which have the most serious signal delay. In an attempt to compensate, a greater signal value than needed may be applied in a portion in which the data signal without the relative signal delay is applied. Accordingly, loads of the data and gate lines are increased.

However, in accordance with the present embodiment, a size of the TFT is designed to be different based on the direction of data line 171. As a result, a deviation in the charges of pixel voltages may be reduced and the load of the signal line may be reduced. Also, in the present embodiment, the channel widths of TFTs respectively corresponding to pixels PX are varied based on the direction of data line 171, in order to turn on gate lines 121 with different horizontal periods 1H. As a result, an output enable (OE) time may be reduced based on a decrease of the gate line.

Figure 4:
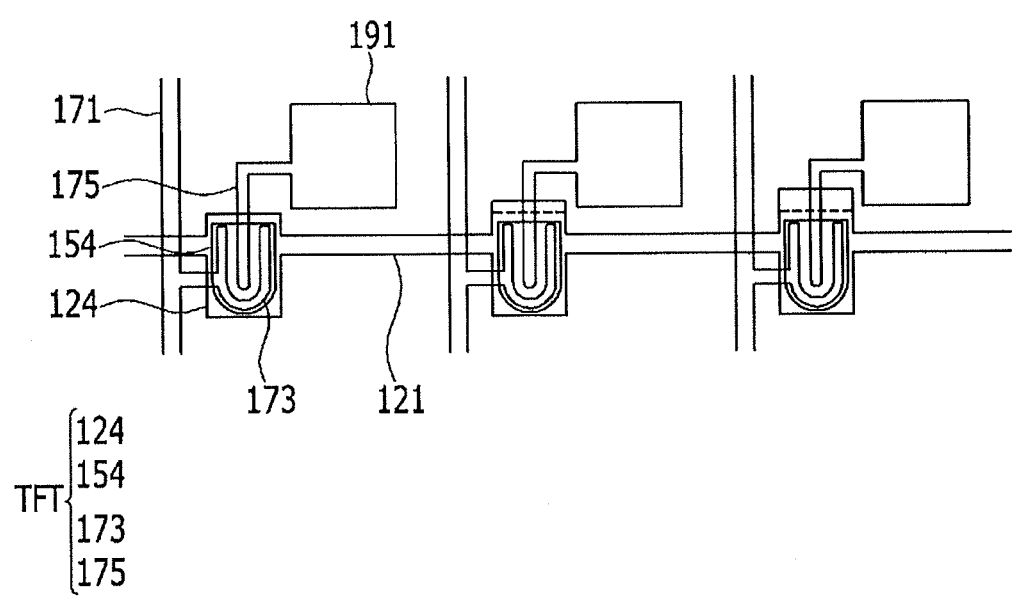
FIG. 4 illustrates an embodiment of a thin film transistor with a shape that changes based on a gate line direction.

FIG. 4 illustrates thin film transistors having a shape that changes based on a gate line direction in a liquid crystal display. Referring to FIG. 4, three pixels are disposed in the direction of gate line 121. The sizes of gate electrodes 124 of the TFTs increase from left to right.

As shown in FIG. 1, when gate driver 400 inputting the gate signal to gate lines 121 is disposed at the left side of liquid crystal panel assembly 300, the signal delay is generated from one end adjacent to gate driver 400 (e.g., the input terminal of the gate signal) to the other end outermost from gate driver 400. A kick-back voltage deviation may be generated by the signal delay of the direction of gate line 121.

In the present embodiment, when two pixels PX disposed in the direction of gate line 121 are selected (which may be referred as an R pixel and an S pixel), parasitic capacitances Cgd of the R pixel and S pixel may be different. When the R pixel is closer to gate driver 400 than the S pixel, the parasitic capacitance Cgd of the TFT in the R pixel is smaller than the parasitic capacitance Cgd of the TFT in S pixel. The parasitic capacitance Cgd may be the capacitance generated between the gate electrode 124 and drain electrode 175.

In the present embodiment, to differentiate the parasitic capacitance Cgd, the overlapping area between the gate electrode 124 and drain electrode 175 may be controlled. The parasitic capacitance Cgd may be increased farther away from gate driver 400 based on the direction of gate line 121 in TFTs of respective pixels PX. In this case, although parasitic capacitance Cgd changes, the channel widths or channel lengths of the TFTs may be the same.

Moreover, according to one embodiment, the pixel is designed to be different in order to increase the parasitic capacitance in the TFT based on the direction of gate line 121, so that kick-back voltage Vkb deviation may be reduced.

Figure 5:
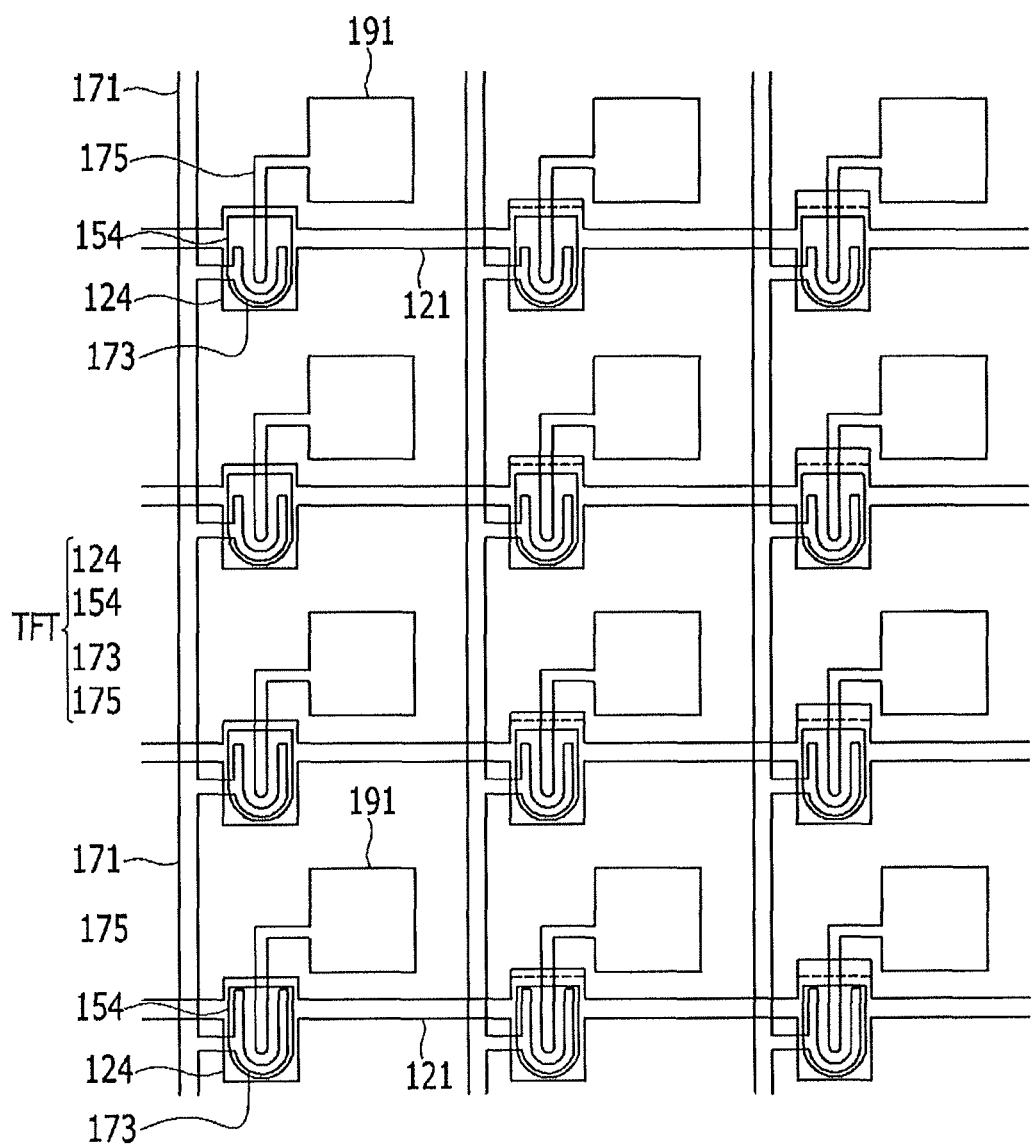
FIG. 5 illustrates an embodiment of a thin film transistor shape in a liquid crystal display.

FIG. 5 illustrates a thin film transistor shape in a liquid crystal display. In FIG. 5, a combination of the embodiments in FIG. 3 and FIG. 4 is shown, where the size of source electrodes 173 of the TFTs increases in a downward direction and the size of gate electrodes 124 of the TFT increases from left to right.

According to the present embodiment, the load of the signal line generated by the charge voltage deviation and kick-back voltage deviation, due to the signal delay generated according to the direction of data line 171 and the direction of gate line 121, may be generated and an after-image for each position may be improved.

Figure 6:
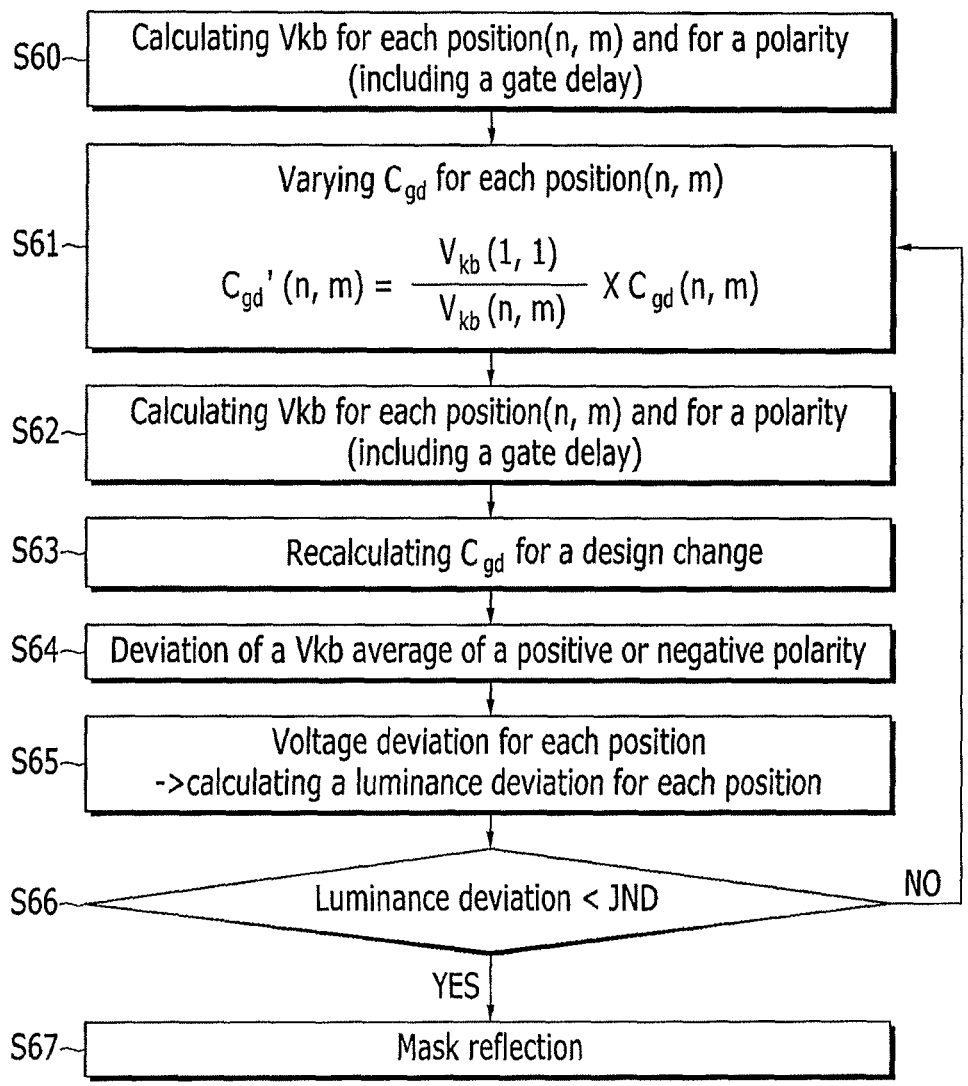
FIG. 6 illustrates an embodiment of a method for calculating luminance deviation by recalculating a parasitic capacitance for each position in a liquid crystal display.

FIG. 6 illustrates an embodiment of a method for calculating luminance deviation in a liquid crystal display. In this method, luminance deviation is calculated by recalculating parasitic capacitance for each position in the display.

More specifically, in operation S60, the method includes calculating the kick-back voltage Vkb for each polarity based on a plurality of pixel positions (n, m). Here, the kick-back voltage may be calculated by taking the delay of the gate line direction into consideration. When the liquid crystal display is driven with polarity inversion, a difference may be generated for the kick-back voltage Vkb in a positive polarity and a negative polarity.

Next, in operation S61, the parasitic capacitance Cgd is varied for each of the pixel positions (n, m) based on Equation 1, where (n, m) corresponds to the pixel in row n and column m. Here, n≥1 and m≥1.

$$C'_{gd}(n, m) = \frac{V_{kb}(1, 1)}{V_{kb}(n, m)} \times C_{gd}(n, m) \qquad (1)$$

The kick-back voltage Vkb (1, 1) of the row 1 and column 1 pixel PX closest to the gate driver and data driver may be largest and the delay of the signal line may be smallest. Accordingly, a value of each parasitic capacitance Cgd of a plurality of pixel positions (n, m) may be increased with reference to the kick-back voltage Vkb (1, 1) of the row 1 and column 1 pixel PX.

Next, in operation S62, the kick-back voltage Vkb for each polarity is calculated again for each of the pixel positions (n, m) with reference to the varied parasitic capacitance Cgd'. Here, the gate line direction delay may be considered.

Next, in operation S63, a shape of the thin film transistor is designed and changed by considering the varied parasitic capacitance Cgd'. After the design change, the value of each parasitic capacitance Cgd for each of the pixel positions (n, m) may be recalculated.

Next, in operation S64, an average deviation of the kick-back voltages Vkb of the positive polarity and the negative polarity is calculated.

Next, in operation S65, a luminance deviation is calculated based on a deviation of an optimized (or predetermined) common voltage Vcom and an actual common voltage for each of the pixel positions (n, m).

Next, in operation S66, the calculated luminance deviation is compared with a just noticeable difference (JND). The just noticeable difference may correspond to a difference of a degree capable of being recognized by a person. When the luminance deviation is more than the just noticeable difference, the described operations are repeatedly performed from operation S61 of varying the parasitic capacitance Cgd for each of the pixel positions (n, m).

When the luminance deviation is less than the just noticeable difference through the repeated operations for the pixel positions (n, m), an additional operation S67 includes reflecting this design data to a mask, in order to manufacture the mask to form the shape of the thin film transistor.

Figure 7:
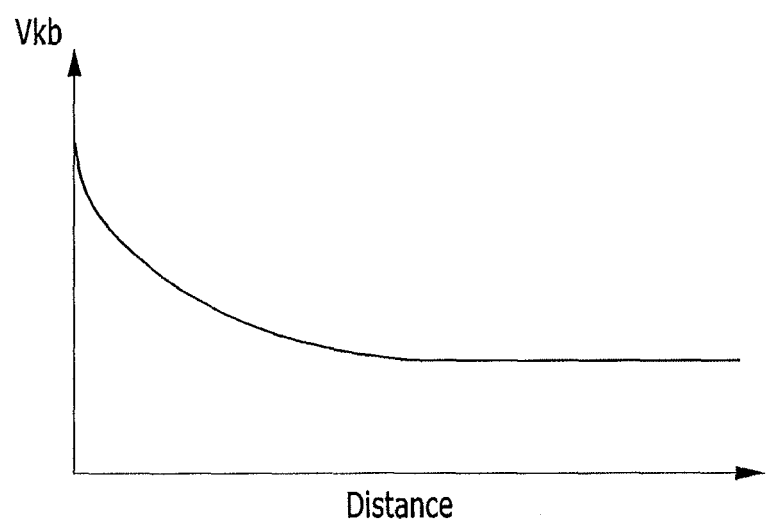
FIG. 7 illustrates a change of a kick-back voltage for increasing dimensions from an input terminal of a gate line.

FIG. 7 is a graph illustrating an example of a change in kick-back voltage for increasing dimensions from an input terminal of a gate line. Referring to FIG. 7, a dimension of a horizontal axis represents a gate line direction in the gate driver. The kick-back voltage decreases with increasing distance from the gate driver.

Figure 8:
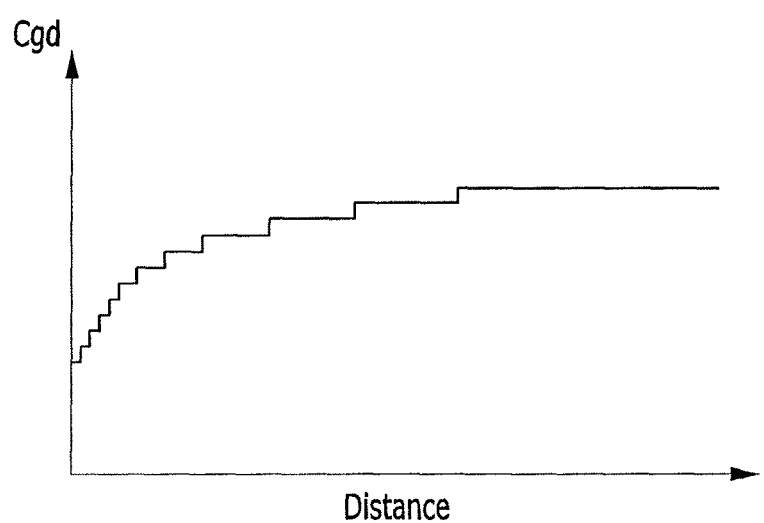
FIG. 8 illustrates a change in parasitic capacitance Cgd between a gate electrode and a drain electrode for increasing dimensions from an input terminal of a gate line.

FIG. 8 is a graph illustrating an example of a change in parasitic capacitance Cgd between a gate electrode and a drain electrode for increasing distance from an input terminal of a gate line in a liquid crystal display. Referring to FIG. 8, varying parasitic capacitance Cgd to compensate for kick-back voltage deviation changes the parasitic capacitance Cgd with a step shape with increasing distance from the gate driver. Thus, the parasitic capacitance Cgd is disconnectedly calculated due to a resolution limitation of the photomask.

Figure 9:
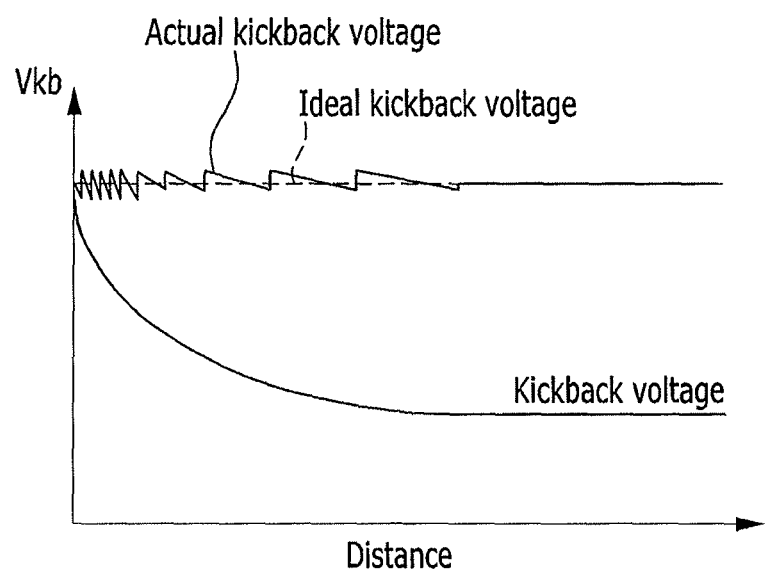
FIG. 9 illustrates change of a kick-back voltage for increasing dimensions from an input terminal of a gate line compared with a change of kick-back voltage for a comparative example of FIG. 7.

FIG. 9 is a graph comparing a change in kick-back voltage with increasing distance from an input terminal of a gate line and a change in kick-back voltage according to a comparative example of FIG. 7 in a liquid crystal display. Referring to FIG. 9, in one embodiment, the actual kick-back voltage measured based on variation in parasitic capacitance Cgd is non-uniform compared with an ideal kick-back voltage.

Figure 10:
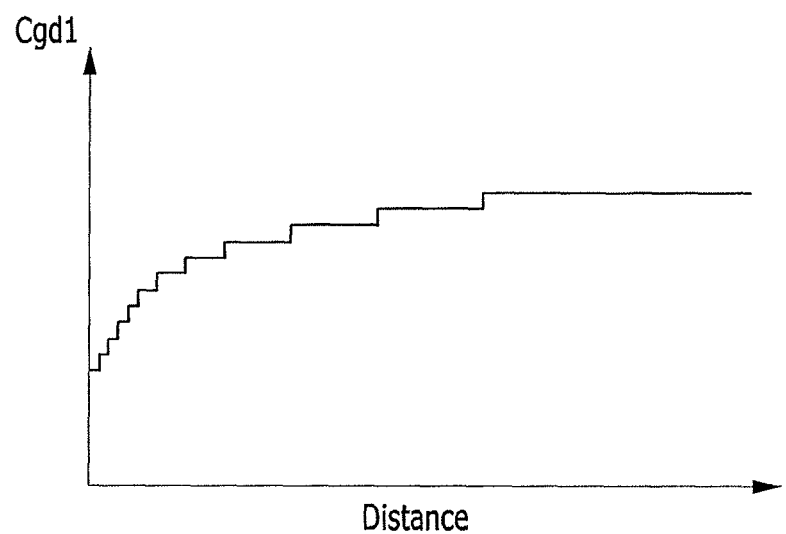
FIG. 10 illustrates a change of a parasitic capacitance Cgd between a gate electrode and a drain electrode for increasing dimensions from an input terminal of a gate line for the gate line for different positions in a liquid crystal display.
Figure 10:
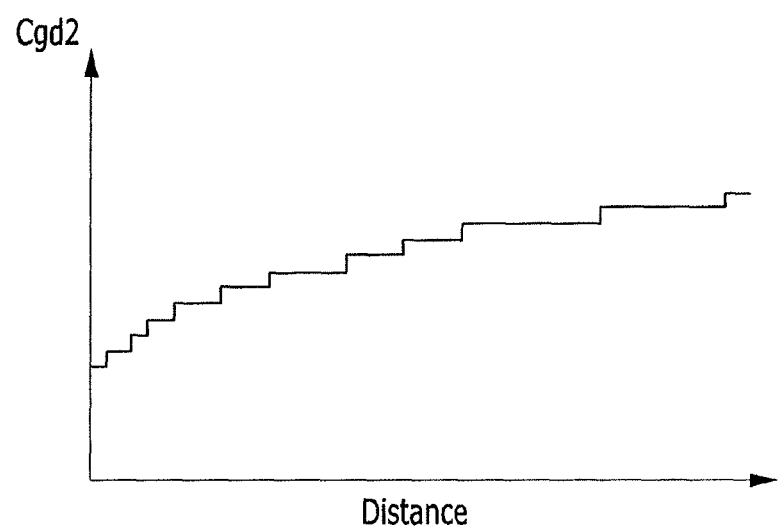
Figure 11:
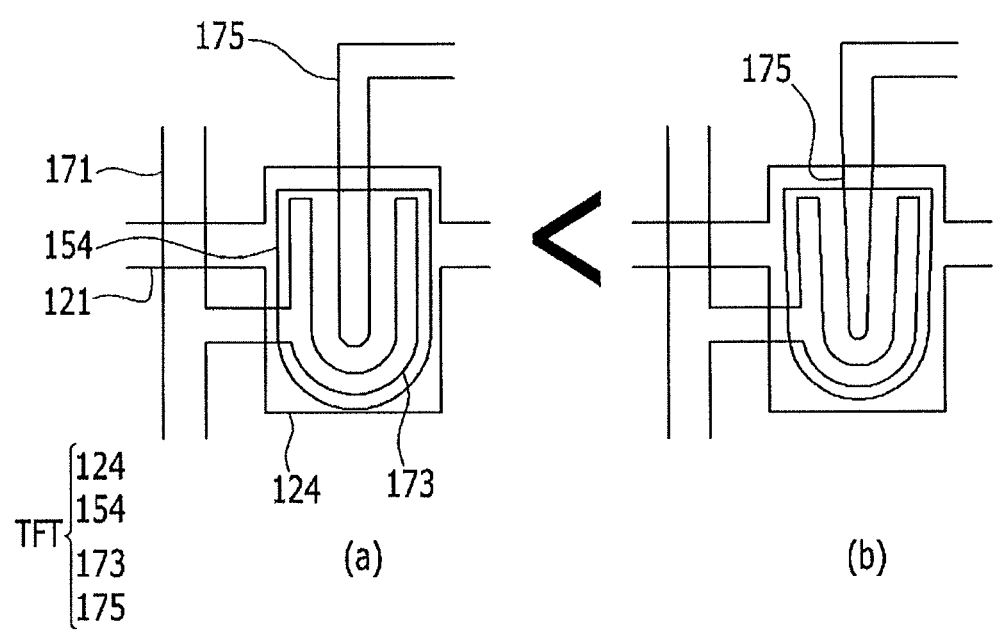
FIG. 11 to FIG. 14 illustrate a shape of a thin film transistor differentiating a parasitic capacitance Cgd between a gate electrode and a drain electrode.
Figure 12:
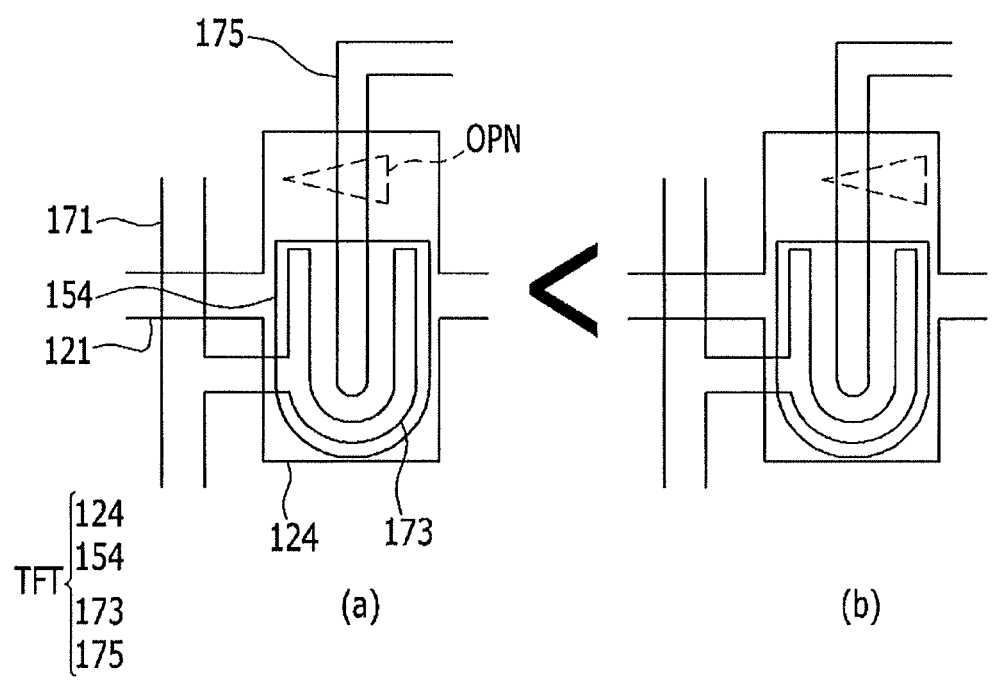

FIG. 10 is a graph measuring a change in parasitic capacitance Cgd between a gate electrode and a drain electrode with increasing distance from an input terminal of a gate line for different positions in a liquid crystal display.

Referring to FIG. 10, a parasitic capacitance distribution of a first gate line and a second gate line is illustrated to have a step shape. The first parasitic capacitance distribution Cgd1 of the first gate line is different from the second parasitic capacitance distribution Cgd2 of the second gate line. The first parasitic capacitance distribution Cgd1 and second parasitic capacitance distribution Cgd2 have step shapes, where the width of the steps change (e.g., increased) with increasing distance from the gate driver. The height of each step may be the same. However, the first and second parasitic capacitance distributions Cgd1 and Cgd2 have steps patterns with different widths in the horizontal direction.

According to one embodiment, the parasitic capacitance Cgd is not varied for the parasitic capacitance distribution corresponding to all gate lines to have the same pattern. This is because of the limitation in resolution of the photomask. The parasitic capacitance Cgd is varied, for the parasitic capacitance distribution corresponding to at least two different gate lines, to have the different patterns. As a result, flicker and an afterimage effect may be reduced or eliminated.

FIGS. 11 to 14 illustrating shapes of a thin film transistor with different parasitic capacitances Cgd between a gate electrode and a drain electrode in accordance with additional embodiments. More specifically, FIGS. 11 to 14 illustrate different methods for increasing parasitic capacitance Cgd with increasing distance from the gate driver in a direction of gate line 121, as in FIG. 4, in a plurality of TFTs corresponding to respective pixels PX.

FIGS. 11(a), 12(a), 13(a), and 14(a) illustrate different embodiments of an R TFT of a pixel adjacent to the gate driver. FIGS. 11(b), 12(b), 13(b), and 14(b) illustrate different embodiments of an S TFT of a pixel far away from the gate driver. In FIGS. 11 to 14, the inequality symbol (e.g., > or <) designates a size comparison of the parasitic capacitance Cgd.

Comparing FIGS. 11(a) and 11(b), one end of drain electrode 175 enclosed by source electrode 173 in the S TFT includes a portion having a width which gradually increases. Also, in the S TFT, the edge of gate electrode 124 crosses the portion where the width of drain electrode 175 of the S TFT gradually increases. In this case, the channel width of this TFT may be constant.

A plurality of pixels is disposed between the pixels in which the R TFT and S TFT are respectively disposed. The thin film transistors corresponding to these pixels include the portion where the width gradually increases toward ends of drain electrodes 175. The area in which the width gradually increases may increase with greater distance from the gate driver, and is smaller than an area of the portion having a width that gradually increases in drain electrode 175 of the S TFT Referring to FIGS. 12(*a*) and 12 (*b*), an opening OPN in gate electrode 124 of the R TFT and gate electrode 124 of the S TFT. The opening OPN may have a shape that overlaps drain electrode 175 and a width which gradually tapers. The area of gate electrode 124, which includes opening OPN of the R TFT that crosses (or overlaps) drain electrode 175 of the R TFT, may be larger than the area of the portion where opening OPN of gate electrode 124 of the S TFT overlaps drain electrode 175 of the S TFT. In this case, the channel width of the TFT may be constant.

A plurality of R pixels may be disposed between pixels in which the thin film transistor and S thin film transistor are respectively disposed. The area of the portion where opening OPN in gate electrodes 124 corresponding to these pixels crosses (or overlaps) drain electrode 175 may decrease with increasing distance from the gate driver, may be larger than the area where opening OPN in gate electrodes 124 of the S TFT crosses (or overlaps) drain electrode 175. The opening OPN may be triangular, or a different shape in other embodiments.

Figure 13:
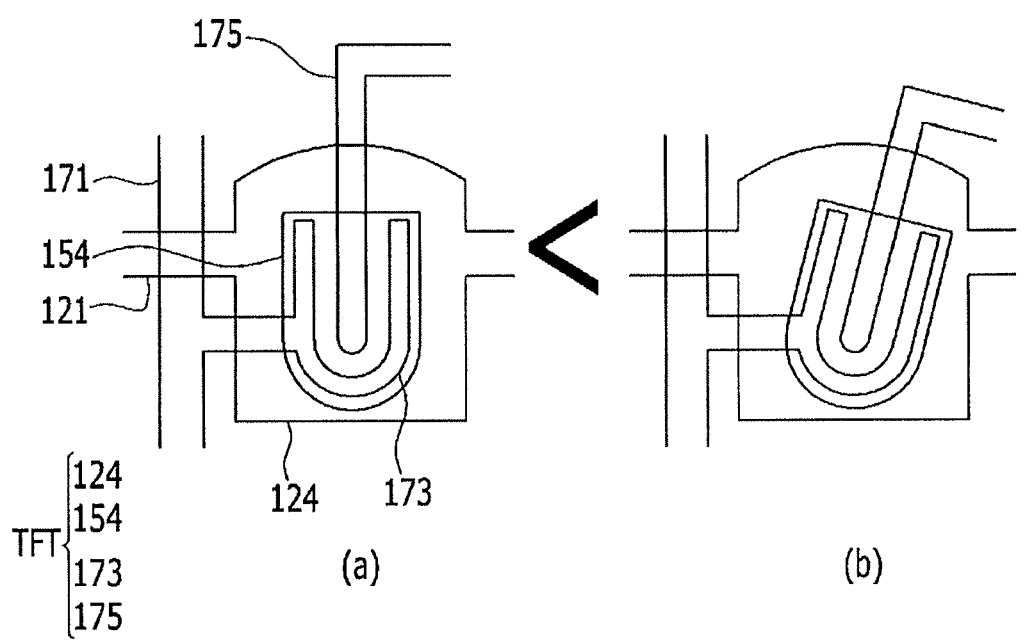

Referring to FIGS. 13(*a*) and 13(*b*), a portion where drain electrode 175 of S TFT overlaps gate electrode 124 of the S TFT is rotated with reference to a portion where drain electrode 175 of the R TFT overlaps gate electrode 124 of the R TFT. The channel width of the TFT may be constant.

A plurality of pixels may be disposed between the pixels where the R and S TFTs are respectively disposed. In the thin film transistors of these pixels, the portion where drain electrode 175 overlaps gate electrode 124 may be rotated relative to the portion where drain electrode 175 of the R TFT overlaps gate electrode 124 of R TFT.

Figure 14:
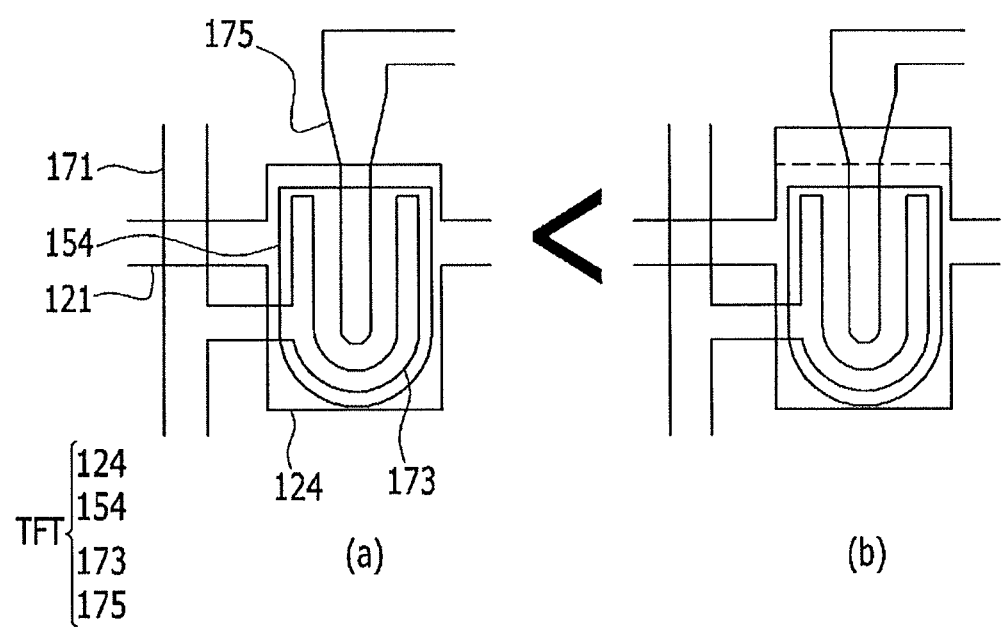

Referring to FIGS. 14(*a*) and 14(*b*), in the R and S TFTs, drain electrode 175 at a location adjacent the edge of gate electrode 124 has a tapered (e.g., gradually increasing) width.

In the portion overlapping the edge of gate electrode 124 of the R TFT, the width of the portion of drain electrode 175 that tapers is smallest. The edge of gate electrode 124 of the STFT crosses (or overlaps) the portion where the width of drain electrode 175 of the S TFT tapers, or gradually increases. The width of the portion where the edge of gate electrode 124 of the R TFT crosses (or overlaps) drain electrode 175 of the R TFT is smaller the width of the portion where the edge of gate electrode 124 of the S TFT crosses drain electrode 175 of the S TFT. At this time, the channel width of the thin film transistor (TFT) may be constant.

A plurality of R pixels may be disposed between the pixels where the R TFTs and S TFTs are respectively disposed. The thin film transistors corresponding to these pixels may include the portion where the width of drain electrode 175 tapers (e.g., gradually increases). The width of the portion where the edge of gate electrode 124 crosses the portion where the width of drain electrode 175 tapers (e.g., gradually increases) may be increased with increasing distance from the gate driver, and may be smaller than the width of the portion where the edge of gate electrode 124 of the S TFT crosses the portion where the width of drain electrode 175 of the S TFT tapers, e.g., gradually increases.

Next, the liquid crystal panel assembly 300 of the liquid crystal display according to an exemplary embodiment will be described with reference to FIG. 15 and FIG. 16. The exemplary embodiment described in FIG. 15 and FIG. 16 is a case that the common electrode 270 is provided to the lower panel 100 differently from FIG. 2.

Figure 15:
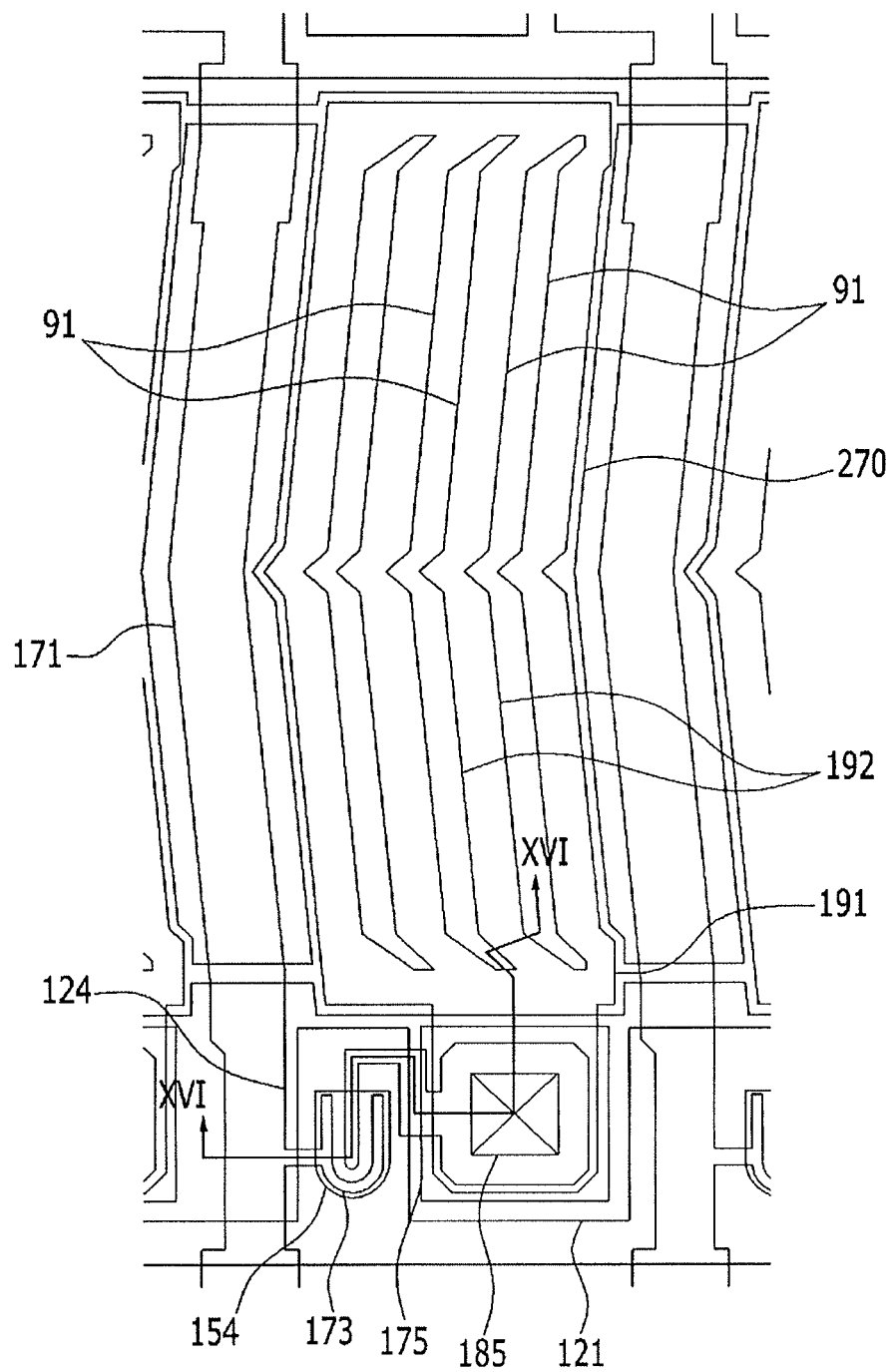
FIG. 15 illustrates an embodiment of a liquid crystal display.
Figure 16:
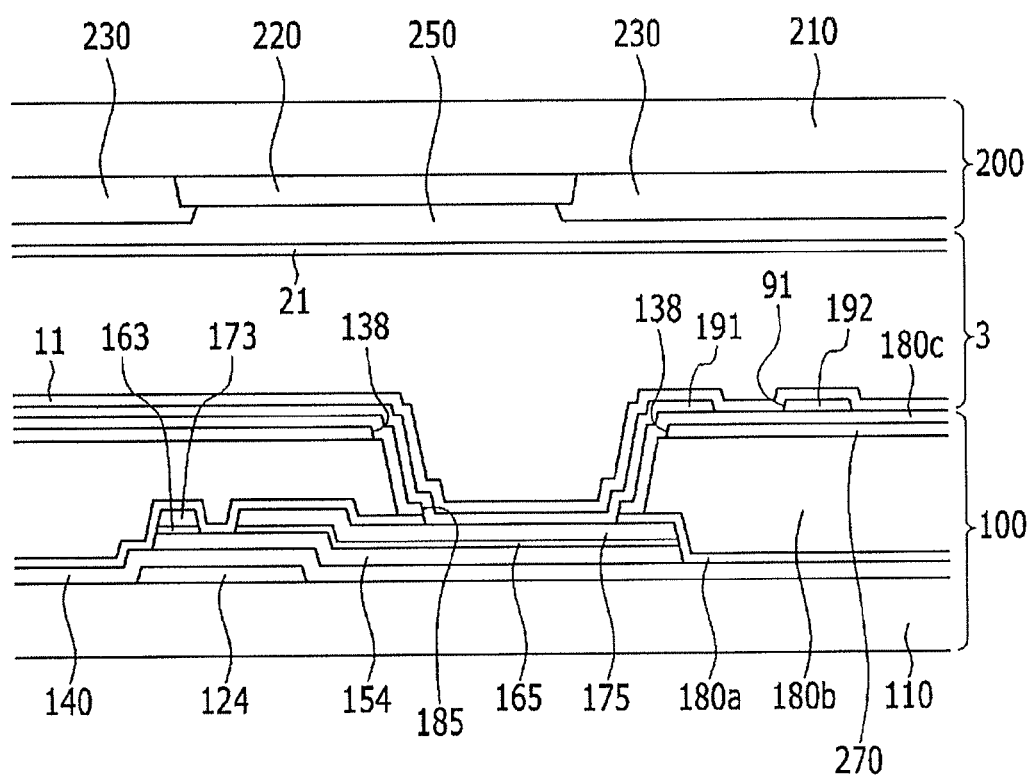
FIG. 16 is a cross-sectional view taken along a line XVI-XVI of FIG. 15.

FIG. 15 is a top plan view of an embodiment of a liquid crystal display, and FIG. 16 is a cross-sectional view taken along a line XVI-XVI of FIG. 15. Referring to FIG. 15 and FIG. 16, the liquid crystal display includes a liquid crystal layer between lower panel 100 and upper panel 200. The display may be the one in FIG. 1 or another display.

The lower panel 100 includes a gate conductor having a gate line 121 on a first substrate 110, which, for example, may be made of transparent glass or plastic. The gate line 121 includes a gate electrode 124 and an end portion for connection with another layer or an external driving circuit. The gate line 121 may be made of, for example, aluminum (Al) or an aluminum-based metal such as an aluminum alloy, silver (Ag) or a silver-based metal such as a silver alloy, copper (Cu) or a copper-based metal such as a copper alloy, molybdenum (Mo) or a molybdenum-based metal such as a molybdenum alloy, chromium (Cr), tantalum (Ta), or titanium (Ti). In another embodiment, gate line 121 may have a multilayer structure including at least two conductive layers with different physical properties.

A gate insulating layer 140 made of a silicon nitride (SiNx) or a silicon oxide (SiOx) is formed on gate line 121. The gate insulating layer 140 may have a multilayer structure including at least two insulating layers having different physical properties.

A semiconductor layer 154, made, for example, of amorphous silicon or polysilicon, is disposed on gate insulating layer 140. The semiconductor layer 154 may include, for example, an oxide semiconductor.

Ohmic contacts 163 and 165 are formed on semiconductor layer 154. The ohmic contacts 163 and 165 may be made of a material such as n+ hydrogenated amorphous silicon, on which an n-type impurity such as phosphorus is doped at a high concentration, or a silicide. A pair of ohmic contacts 163 and 165 may be disposed on semiconductor layer 154. When semiconductor layer 154 is an oxide semiconductor, ohmic contacts 163 and 165 may be omitted.

A data conductor, including a data line 171 having source electrode 173 and drain electrode 175, is formed on ohmic contacts 163 and 165 and gate insulating layer 140. The data line 171 may have a wide end portion for connection with another layer or an external driving circuit. The data line 171 transfers a data signal and extends mainly in a vertical direction to cross gate line 121.

The data line 171 may have a curved portion with a curved shape to obtain maximum or other predetermined transmittance of the liquid crystal display. The data line 171 may have curved portions that meet each other at an intermediate region of the pixel area, for example, to form a V shape.

The source electrode 173 extends from data line 171 toward gate electrode 124, to thereby form a U shape. The drain electrode 175 includes a portion extending upward from a center of the U shape of source electrode 173, while being separated from data line 171. The shape and arrangement of source electrode 173 and drain electrode 175 may be changed.

The gate electrode 124, source electrode 173, and drain electrode 175 form a thin film transistor, together with semiconductor 154. A channel of the thin film transistor is formed on semiconductor 154 between source electrode 173 and drain electrode 175.

The liquid crystal display includes source electrode 173 disposed on the same line as data line 171 and drain electrode 175 extending parallel to the data line 171, so that the width of the thin film transistor may be widened without increasing an area of the data conductor. This arrangement may increase the aperture ratio of the liquid crystal display.

Data line 171 and drain electrode 175 may be made of a refractory metal such as molybdenum, chromium, tantalum, and titanium, or an alloy thereof, and may have a multilayer structure including a refractory metal layer and a low resistance conductive layer. Examples of the multilayer structure include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer.

A first passivation layer 180a is formed on data conductors 171, 173, and 175, gate insulating layer 140, and exposed portion of the semiconductor 154. The first passivation layer 180a may be made of an organic or inorganic insulating material.

A second passivation layer 180b is formed on first passivation layer 180a. The second passivation layer 180b may be made of an organic insulator.

The second passivation layer 180b may be a color filter. When second passivation layer 180b is a color filter, the second passivation layer 180b may inherently display one of a plurality of primary colors. Examples of the primary colors include red, green, and blue, or yellow, cyan, and magenta. The color filter may further include a color filter 230 displaying a combination of at least two of the primary colors or white. When second passivation layer 180b is a color filter, color filter 230 may be omitted in upper panel 200 as will be described later.

A common electrode 270 is disposed on second passivation layer 180b. The common electrode 270 has a planar shape, may be formed on the entire first substrate 110 as a plate, and may have an opening 138 in a region corresponding to the periphery of drain electrode 175. Thus, common electrode 270 may have the planar shape.

Common electrodes 270 on adjacent pixels are connected to each other to receive a common voltage at a predetermined level from outside the display area.

An insulating layer 180c is disposed on common electrode 270. The insulating layer 180c may be formed of an organic or inorganic insulating material.

A pixel electrode 191 is disposed on insulating layer 180c. The pixel electrode 191 includes a curved edge which is substantially parallel to the curved portion of data line 171. The pixel electrode 191 may include a plurality of cutouts 91. A plurality of branch electrodes 192 may be disposed between the adjacent cutouts 91.

The pixel electrode 191 is a first field generating electrode or a first electrode. The common electrode 270 is a second field generating electrode or a second electrode. The pixel electrode 191 and common electrode 270 may form a horizontal electric field.

The first passivation layer 180a, second passivation layer 180b, and insulating layer 180c have a first contact hole 185 exposing drain electrode 175. The pixel electrode 191 is physically and electrically connected to drain electrode 175 through first contact hole 185, to receive a voltage from drain electrode 175.

A first alignment layer 11 is formed on pixel electrode 191 and insulating layer 180c. The first alignment layer 11 includes a photoreactive material, which is a vertical alignment material.

The upper panel 200 includes a light blocking member 220 formed on a second substrate 210 made, for example, of transparent glass or plastic. The light blocking member 220 may be referred to as a black matrix which blocks light leakage.

A plurality of color filters 230 are formed on second substrate 210. In the case where second passivation layer 180b of lower panel 100 is a color filter, color filter 230 of upper panel 200 may be omitted. Further, light blocking member 220 of upper panel 200 may also be formed on lower panel 100.

An overcoat 250 is formed on color filter 230 and light blocking member 220. The overcoat 250 may be made of an (e.g., organic) insulator, prevents color filter 230 from being exposed, and provides a flat surface. The overcoat 250 may be omitted in an alternative embodiment.

A second alignment layer 21 is formed on overcoat 250. The second alignment layer 21 may be formed of the same material and by the same method as the described first alignment layer 11.

The liquid crystal layer 3 may include a liquid crystal material having dielectric anisotropy. Liquid crystal molecules of liquid crystal layer 3 may be aligned so that their long axes are parallel or perpendicular to surfaces of display panels 100 and 200.

The pixel electrode 191 receives a data voltage from drain electrode 175. The common electrode 270 receives a common voltage at a predetermined level from a common voltage application unit disposed outside the display area.

The pixel electrode 191 and common electrode 270 operate as field generating electrodes to generate an electrical field. Liquid crystal molecules of liquid crystal layer 3 disposed thereon are rotated in a direction parallel to the direction of the electric field. The polarization of light passing through the liquid crystal layer is changed based on the rotation direction of the liquid crystal molecules.

By forming two field generating electrodes 191 and 270 on one display panel 100, transmittance of the liquid crystal display is increased and a wide viewing angle may be realized.

In one embodiment, common electrode 270 may have a planar shape and pixel electrode 191 may have a plurality of branch electrodes. In another embodiment, pixel electrode 191 may have a planar shape and common electrode 270 may have a plurality of branch electrodes.

One or more of the aforementioned embodiments cover may cover all cases in which two field generating electrodes overlap via the insulating layer on the first substrate 110. Also, the first field generating electrode under the insulating layer may have a plane shape, and the second field generating electrode on the insulating layer may have a plurality of branch electrodes.

By way of summation and review, a liquid crystal display may include thin film transistors, and gate lines and data lines which cross each other. The thin film transistors may be connected to respective pixels. In operation, a parasitic capacitance generated in an overlapping portion of a source electrode/drain electrode and a gate electrode of the thin film transistor may have the effect of dropping a data voltage, when changing from a gate-on voltage to a gate-off voltage. A voltage difference between the dropped data voltage Vd, in other words, the input data voltage, and a pixel voltage at which the data voltage charges the pixel, may be referred to as a kick-back voltage Vkb.

Under certain circumstances, it may not be easy to form thin film transistors having uniform electrical characteristics in all pixels because of deviations that practically occur during the manufacturing process. Also, in the liquid crystal display, a gate signal and a data signal are supplied from one end of each of the gate line and data line and are transmitted to the other end thereof. Accordingly, a signal voltage of a desired degree is supplied to pixels adjacent to one end of each signal line, and the kick-back voltage is reduced or the pixel voltage is changed to be lower than a target value by a resistor-capacitance delay (a RC delay) of each signal line.

In accordance with one or more of the aforementioned embodiments, a liquid crystal display is provided with reduced kick-back voltage deviation and charge voltage deviation. Also, the size of the thin film transistors may change from one end supplied with a data signal to another other end. This may allow the load of the signal line to be reduced. Also, parasitic capacitance between the gate-drain may be increased in from one end (supplied with the gate signal) to another to reduced kick-back voltage deviation.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A liquid crystal display, comprising:
a gate line and a data line disposed on a substrate and crossing each other;
a gate driver to apply a gate signal to the gate line;
a data driver to apply a data signal to the data line; and
a first pixel and a second pixel arranged in an extending direction of the data line and connected to the same data line, wherein:
the first pixel is closer to the data driver than the second pixel, and
the first pixel comprises a first thin film transistor and the second pixel comprises a second thin film transistor, and
the first thin film transistor includes a first gate electrode, a first source electrode and a first drain electrode, and
the second thin film transistor includes a second gate electrode, a second source electrode and a second drain electrode, and
a size of the second source electrode is greater than a size of the first source electrode and channel lengths of the first and second thin film transistors are equal.

2. The display as claimed in claim 1, wherein the first source electrode and the second source electrode include a curved shape.

3. The display as claimed in claim 2, wherein:
a length of the first source electrode that surrounds the first drain electrode is less than a length of the second source electrode that surrounds the second drain electrode in a plan view.

4. The display as claimed in claim 3, wherein widths of the first source electrode and the second source electrode are the same.

5. The display as claimed in claim 1, wherein a channel width of the first thin film transistor is less than a channel width of the second thin film transistor.

6. The display as claimed in claim 5, wherein a length of the first source electrode that overlaps/faces the first drain electrode is less than a length of the second source electrode that overlaps/faces the second drain electrode in a plan view.

7. The display as claimed in claim 6, wherein widths of the first source electrode and the second source electrode are the same.

8. The display as claimed in claim 1, wherein a length of the first source electrode that overlaps/faces the first drain electrode is less than a length of the second source electrode that overlaps/faces the second drain electrode in a plan view.

9. The display as claimed in claim 1, further comprising:
a third pixel arranged with the first pixel in an extending direction of the gate line,
wherein the first pixel and the third pixel are connected to the same gate line.

10. The display as claimed in claim 9, wherein:
a channel width of the first pixel and a channel width of the third pixel are the same, and
a channel length of the first pixel and a channel length width of the third pixel are the same.

11. The display as claimed in claim 9, further comprising:
a fourth pixel arranged with the third pixel in an extending direction of the gate line, wherein the third pixel and the fourth pixel are connected to the same gate line.

12. The display as claimed in claim 11, wherein a parasitic capacitance between a third gate electrode and a third drain electrode of a third thin film transistor of the third pixel is less than a parasitic capacitance between a fourth gate electrode and a fourth drain electrode of a fourth thin film transistor of the fourth pixel.

13. The display as claimed in claim 12, wherein a parasitic capacitance between a gate electrode and a drain electrode increases with increasing distance from the gate driver in an extending direction of the gate line.

14. The display as claimed in claim 13, further comprising a first gate line and a second gate line,
wherein a first parasitic capacitance distribution of the first gate line is different from a second parasitic capacitance distribution of the second gate line, and
the first and second parasitic capacitance distributions have substantially a step pattern having step widths that increase with increasing distance from the gate driver.

* * * * *